United States Patent
Haynes et al.

(10) Patent No.: US 11,560,919 B2
(45) Date of Patent: Jan. 24, 2023

(54) ACTUATOR WITH BUCKLING MEMBER STABILITY

(71) Applicant: U.S. Army Combat Capabilities Development Command, Army Research Laboratory, Adelphi, MD (US)

(72) Inventors: Robert A. Haynes, Yorktown, VA (US); Todd C. Henry, Aberdeen, MD (US); Michael D. Coatney, Bel Air, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 195 days.

(21) Appl. No.: 16/842,962

(22) Filed: Apr. 8, 2020

(65) Prior Publication Data

US 2021/0317868 A1 Oct. 14, 2021

(51) Int. Cl.
| | | |
|---|---|---|
| *F16C 1/10* | (2006.01) | |
| *F16C 1/16* | (2006.01) | |
| *H01H 1/00* | (2006.01) | |
| *H01H 1/20* | (2006.01) | |
| *B81B 3/00* | (2006.01) | |

(52) U.S. Cl.
CPC ............... *F16C 1/16* (2013.01); *F16C 1/106* (2013.01); *H01H 1/0036* (2013.01); *B81B 3/0018* (2013.01); *B81B 2201/01* (2013.01); *B81B 2201/016* (2013.01); *H01H 1/20* (2013.01); *H01H 2001/0042* (2013.01); *H01H 2001/0084* (2013.01)

(58) Field of Classification Search
USPC .......................................................... 200/181
See application file for complete search history.

(56) References Cited

U.S. PATENT DOCUMENTS

| | | | |
|---|---|---|---|
| 6,239,685 B1 | 5/2001 | Albrecht et al. | |
| 6,911,891 B2 | 6/2005 | Qiu et al. | |
| 7,075,209 B2* | 7/2006 | Howell | F03G 7/06 73/514.01 |
| 7,304,556 B2 | 11/2007 | Tamura et al. | |
| 2005/0073380 A1 | 4/2005 | Howell et al. | |
| 2007/0188846 A1* | 8/2007 | Slicker | H01H 1/0036 359/290 |

* cited by examiner

*Primary Examiner* — Toan T Vu
*Assistant Examiner* — Xuan Ly
(74) *Attorney, Agent, or Firm* — Christos S. Kyriakou

(57) ABSTRACT

A device includes a frame including a first end and a second end; a mechanism including a first side that faces the first end of the frame, and a second side that faces the second end of the frame; a first buckling member attached to the first side of the mechanism and the first end of the frame; a second buckling member attached to the second side of the mechanism and the second end of the frame; and at least one actuator that engages the mechanism, the first buckling member, and the second buckling member in a selective sequence causing the mechanism to articulate between the first end and the second end of the frame. Engagement of the first buckling member and the second buckling member by the at least one actuator causes the first buckling member and the second buckling member to buckle and unbuckle in the selective sequence.

19 Claims, 15 Drawing Sheets

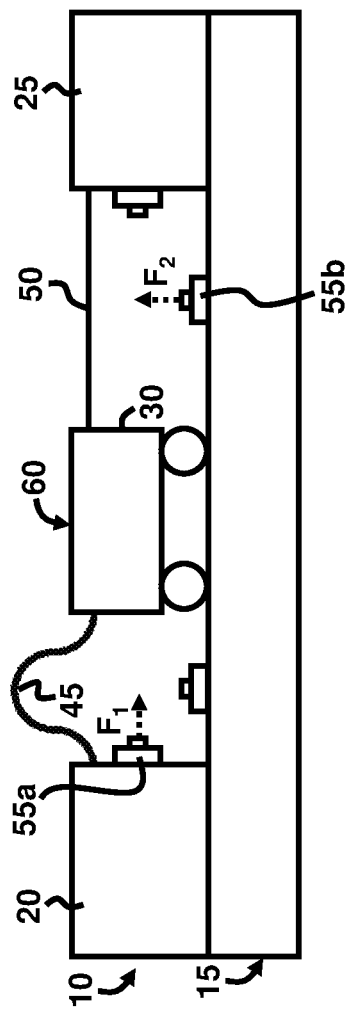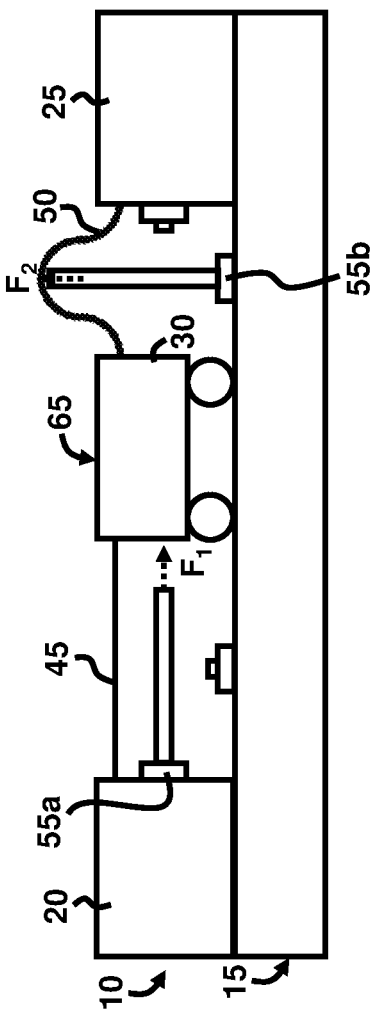

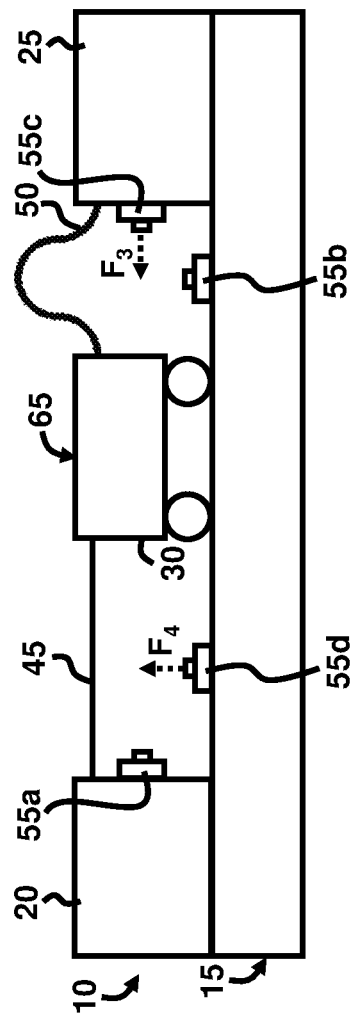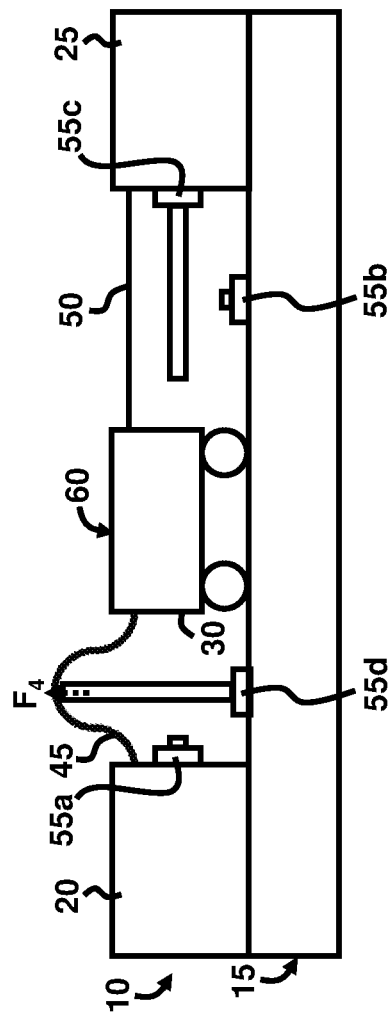

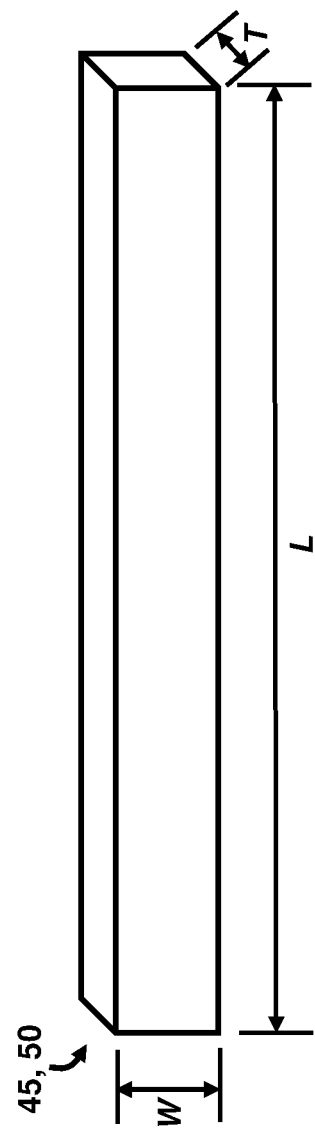

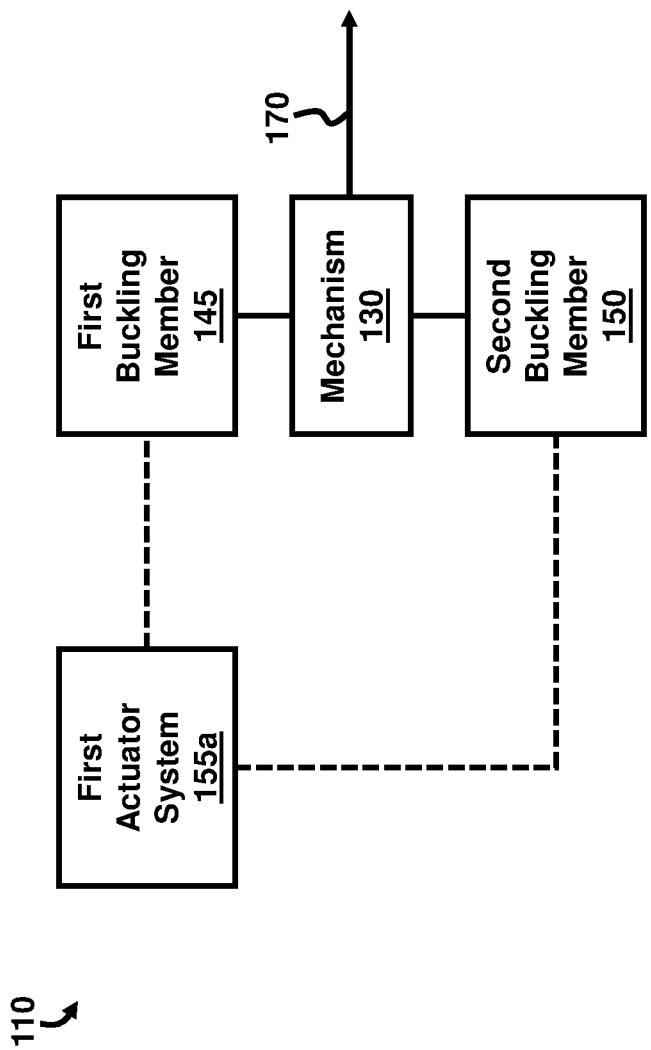

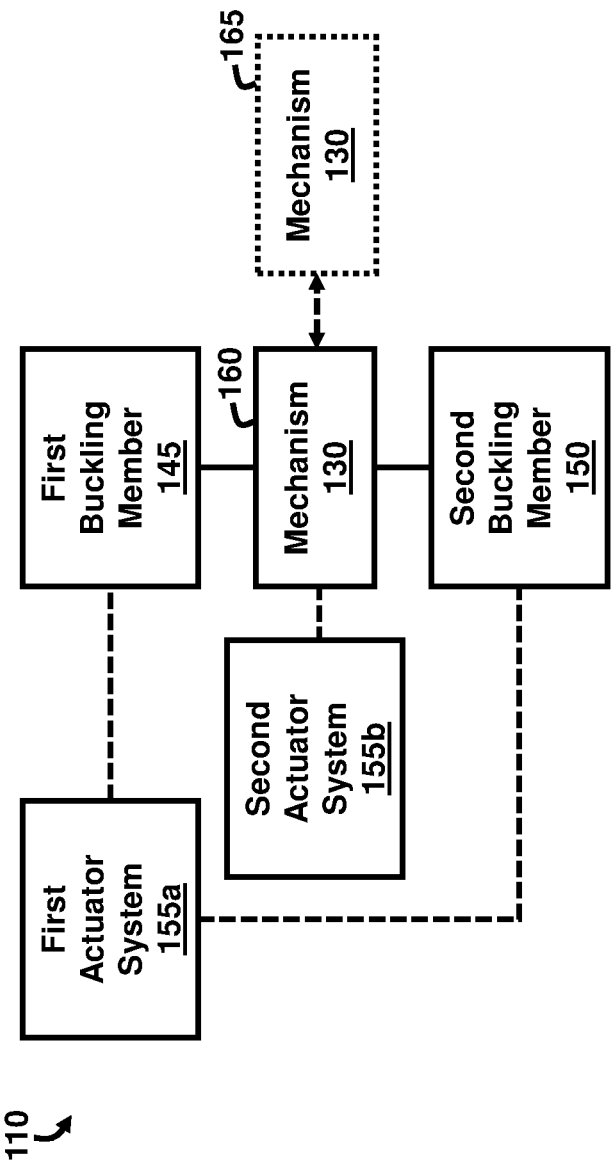

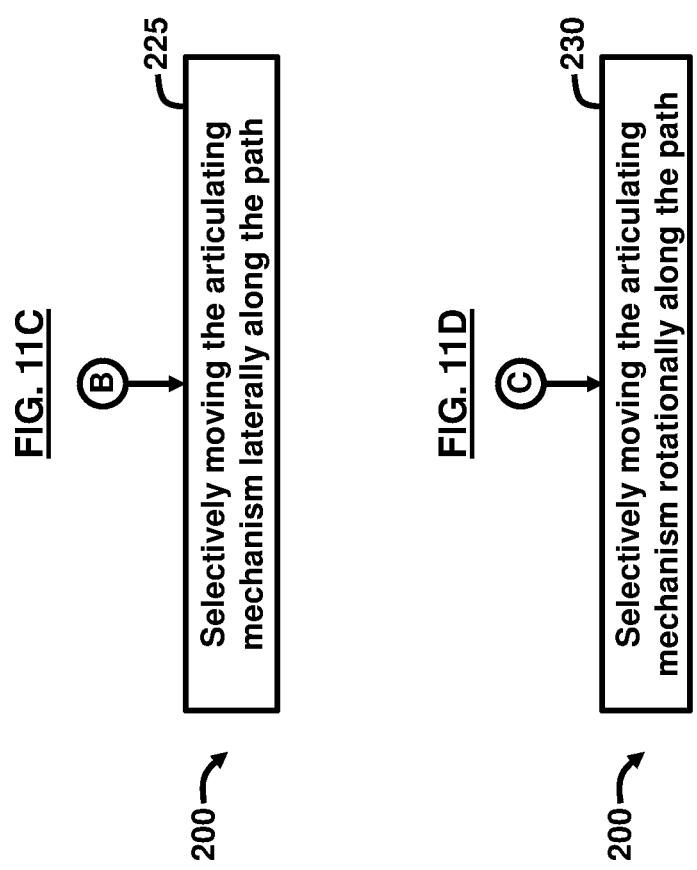

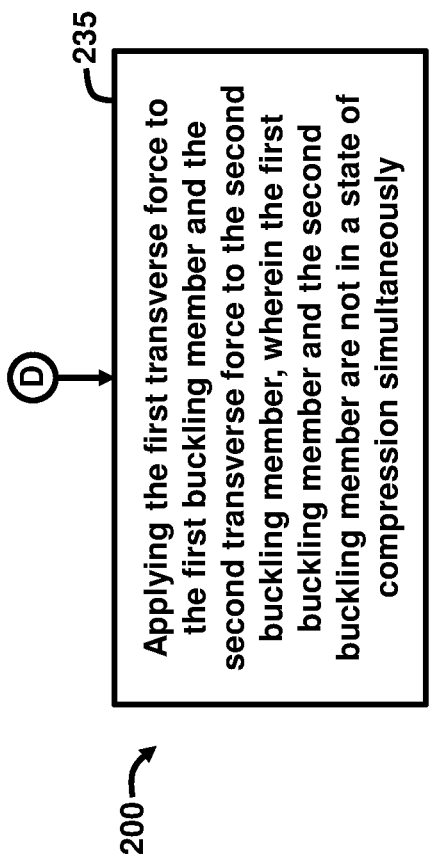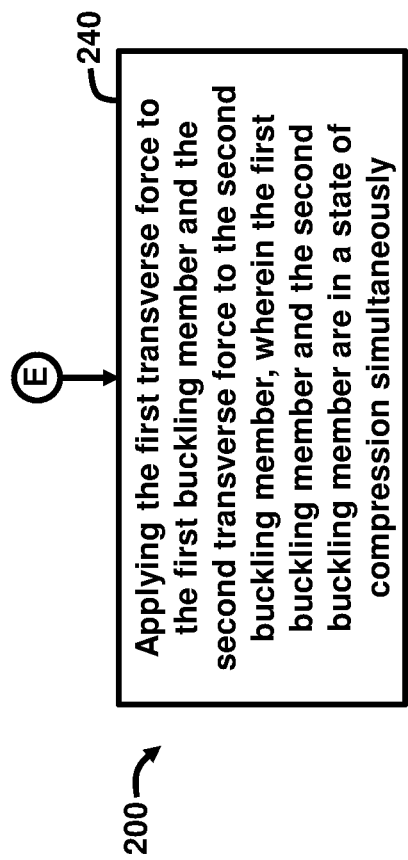

ACTUATOR WITH BUCKLING MEMBER STABILITY

GOVERNMENT INTEREST

The embodiments herein may be manufactured, used, and/or licensed by or for the United States Government without the payment of royalties thereon.

BACKGROUND

Technical Field

The embodiments herein generally relate to actuator systems, and more particularly to actuators that provide bistability of attached members.

Description of the Related Art

Various techniques exist for providing bistability of structural components. Such techniques may be used for various types of electromechanical systems including microelectromechanical systems (MEMs), optical switches, optical shutters, relays, valves, threshold switches, or other uses requiring a shifting or movement of a member from position-to-position. The bistable mechanisms may rely on displacement of components to create the movement for the member. Generally, these bistable mechanisms may rely on a complex set of latches, hinges, or other multi-component devices, which can prove to be unreliable, suffer from structural defects due to mechanical fatigue of the components, result in unstable operation, or may otherwise not be suitable for all applications. Furthermore, most switching devices typically have multiple stable positions, and the energy required to move from one position into the other is fixed. This is because the mechanism keeping the device in a stable position generally cannot be modified, so the energy required to switch into another position is the energy associated with loading the mechanism until it overcomes some fixed energy barrier. However, this is not ideal for applications subject to different loads and requiring different energy thresholds for activation. Moreover, with advances in manufacturing techniques of micro-sized (or smaller) components as well as increased applications requiring bistable components, there remains a need for a new type of bistable mechanism.

SUMMARY

In view of the foregoing, an embodiment herein provides a device comprising a frame comprising a first end and a second end; a mechanism comprising a first side that faces the first end of the frame, and a second side that faces the second end of the frame; a first buckling member attached to the first side of the mechanism and the first end of the frame; a second buckling member attached to the second side of the mechanism and the second end of the frame; and at least one actuator that engages the mechanism, the first buckling member, and the second buckling member in a selective sequence causing the mechanism to articulate between the first end and the second end of the frame, wherein engagement of the first buckling member and the second buckling member by the at least one actuator causes the first buckling member and the second buckling member to buckle and unbuckle in the selective sequence.

The at least one actuator may comprise a first actuator that applies a first force to the mechanism causing the mechanism to move from a first position to a second position; and a second actuator that applies a second force to the second buckling member causing the second buckling member to buckle and the first buckling member to unbuckle. The first actuator and the second actuator may simultaneously apply the first force and the second force, respectively.

The at least one actuator may comprise a third actuator that applies a third force to the mechanism causing the mechanism to move from the second position to the first position; and a fourth actuator that applies a fourth force to the first buckling member causing the first buckling member to buckle and the second buckling member to unbuckle. The third actuator and the fourth actuator may simultaneously apply the third force and the fourth force, respectively. The first force and the third force may comprise axial forces applied to the mechanism. The second force and the fourth force may comprise transverse forces applied to the second buckling member and the first buckling member, respectively. The first buckling member and the second buckling member each may comprise a length longer than a width or thickness thereof. The first buckling member and the second buckling member each may comprise a predetermined failure strain to allow the first buckling member and the second buckling member to buckle without fracturing.

Another embodiment provides a switch comprising at least one mechanism configured to move; a first buckling member attached to the at least one mechanism; a second buckling member attached to the at least one mechanism; and a first actuator system that selectively (i) engages the first buckling member and disengages the second buckling member, and (ii) disengages the first buckling member and engages the second buckling member, wherein selective engagement and disengagement of the first buckling member and the second buckling member results in movement of the at least one mechanism. The switch may comprise a second actuator system that selectively engages the at least one mechanism causing the at least one mechanism to move from a first position to a second position and back to the first position. The first actuator system and the second actuator system may be individually controlled. The first actuator system and the second actuator system may be linked to each other. The switch may comprise a frame housing the at least one mechanism, wherein the frame attaches to the first buckling member and the second buckling member.

Another embodiment provides a method of actuation comprising positioning an articulating mechanism along a path in a frame comprising a first buckling member and a second buckling member; and selectively articulating the first buckling member and the second buckling member causing the articulating mechanism to move from a first position to a second position or vice versa along the path by selectively applying and removing a first transverse force to/from a first buckling member and selectively applying and removing a second transverse force to/from a second buckling member.

The method may comprise selectively applying a first axial force to the articulating mechanism causing the articulating mechanism to move from the first position to the second position along the path; and selectively applying a second axial force to the articulating mechanism causing the articulating mechanism to move from the second position to the first position along the path. The method may comprise selectively moving the articulating mechanism laterally along the path. The method may comprise selectively moving the articulating mechanism rotationally along the path. The method may comprise applying the first transverse force to the first buckling member and the second transverse force to the second buckling member, wherein the first buckling member and the second buckling member are not in a state of compression simultaneously. The method may comprise applying the first transverse force to the first buckling member and the second transverse force to the second buckling member, wherein the first buckling member and the second buckling member are in a state of compression simultaneously.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 2A and 2B are schematic diagrams illustrating sequential conditions of the device of FIGS. 1A through 1E with a first and second actuator applying forces to the articulating mechanism, according to an embodiment herein;

FIGS. 3A and 3B are schematic diagrams illustrating sequential conditions of the device of FIGS. 1A through 1E with a third and fourth actuator applying forces to the articulating mechanism, according to an embodiment herein;

FIG. 5 is a schematic diagram illustrating aspects of the buckling members of the device of FIG. 1, according to an embodiment herein;

FIG. 6 is a block diagram illustrating a switch with a first actuator system, according to an embodiment herein;

FIG. 7 is a block diagram illustrating the switch of FIG. 6 with a second actuator system, according to an embodiment herein;

FIG. 11C is a flow diagram illustrating a method of laterally moving an articulating mechanism, according to an embodiment herein;

FIG. 11D is a flow diagram illustrating a method of rotationally moving an articulating mechanism, according to an embodiment herein;

FIG. 11E is a flow diagram illustrating a method of applying forces to buckling members, according to an embodiment herein; and FIG. 11F is a flow diagram illustrating another method of applying forces to buckling members, according to an embodiment herein.

DETAILED DESCRIPTION

Figure 1A:
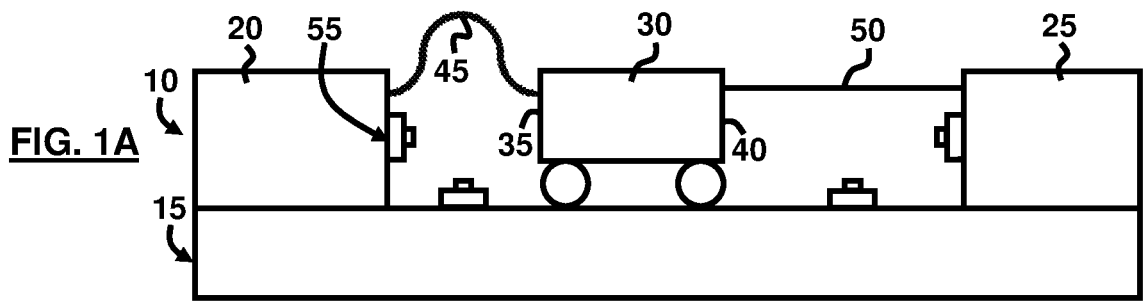
FIGS. 1A through 1E are schematic diagrams illustrating sequential conditions of a device with an articulating mechanism and with buckling member stability, according to an embodiment herein.
Figure 1B:
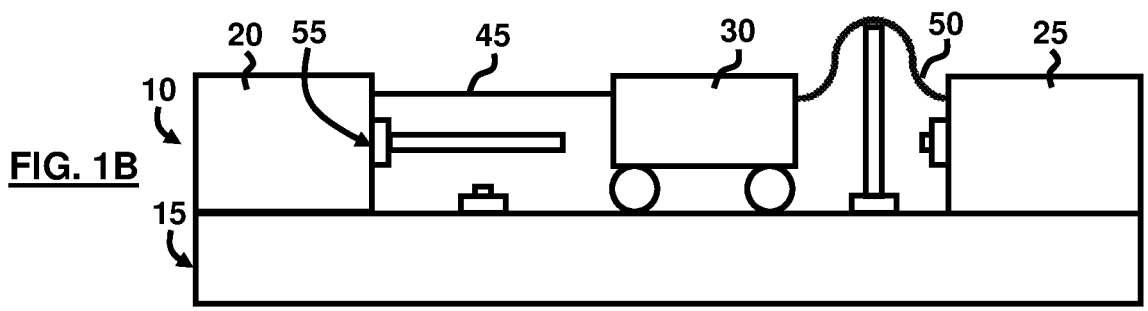
Figure 1C:
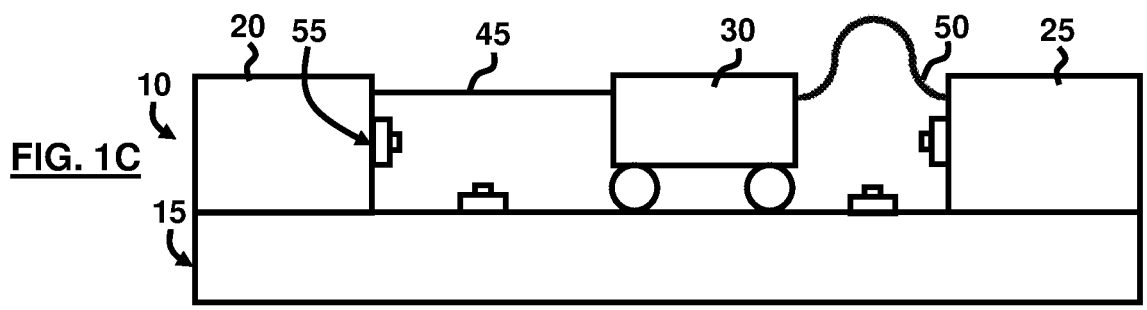
Figure 1D:
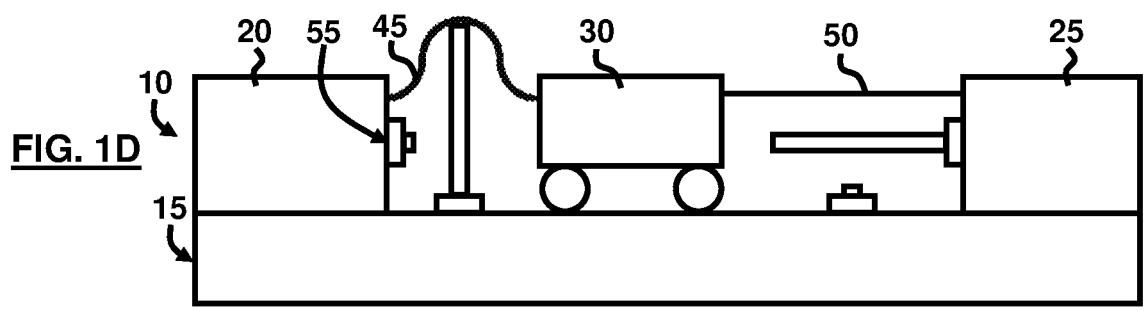
Figure 1E:
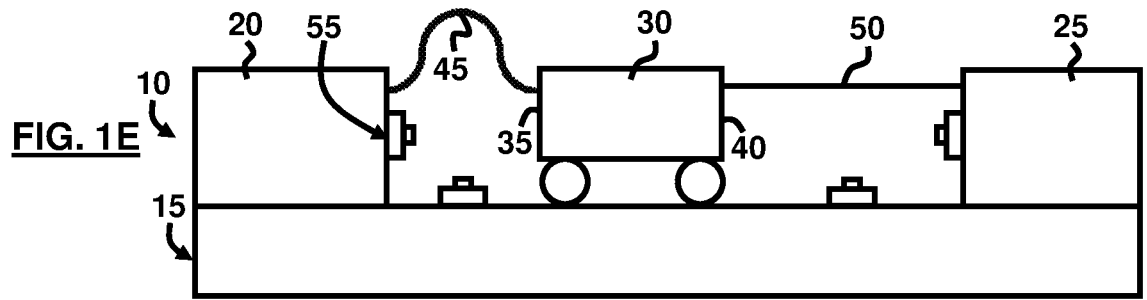

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide an actuator device that can robustly remain in a particular position because of a member that braces it. The device can switch between positions with relatively low force applied transverse to the bracing member causing it to buckle. When the member buckles, the device moves to another position and is braced by another member that unbuckles, keeping it robustly in the new position until the new member is buckled. The embodiments herein may be utilized in various applications including electrical switches such as to open and close electric circuits, door/gate locks of any size, load-limiting devices wherein the buckling load is tailored to allow the device to buckle and move into a new configuration when the axial load reaches a desired level, deployment mechanisms for devices that need to extend such as sensors or probes on a boom for space structures or other types of structures, or as a mechanism to actuate span morphing in vehicles such as unmanned aerial vehicles (UAVs) and systems to allow them to reconfigure without requiring energy to keep the vehicle in a given configuration, among other uses and applications. Referring now to the drawings, and more particularly to FIGS. 1A through 11F, where similar reference characters denote corresponding features consistently throughout the figures, there are shown preferred embodiments. In the drawings, the size and relative sizes of components, layers, and regions, etc. may be exaggerated for clarity.

FIGS. 1A through 1E, are schematic diagrams illustrating sequential conditions of a device 10 comprising a frame 15 comprising a first end 20 and a second end 25. The frame 15 may comprise any suitable size, shape, and configuration. Furthermore, the frame 15 may be a fixed structure, a moveable structure, a standalone structure, or may be part of a larger system or device and connected thereto either directly or indirectly. The first end 20 and second end 25 may be directly opposite one another or there may be intervening structures positioned therebetween. Furthermore, the first end 20 and the second end 25 may be fixed to the frame 15 or may be removably attached thereto. The first end 20 and the second end 25 may be part of the same continuous overall structure of the frame 15 or may be separate discrete structures apart from the frame 15.

The device 10 further comprises a mechanism 30 comprising a first side 35 that faces the first end 20 of the frame 15, and a second side 40 that faces the second end 25 of the frame 15. The mechanism 30 may be an electro-mechanical, electro-magnetic, mechanical, or magnetic device, or a combination thereof. Furthermore, the mechanism 30 may comprise any suitable size, shape, or configuration. In an example, the mechanism 30 is constrained by the frame 15 such that the mechanism 30 is moveable within the frame 15. The mechanism 30, which may be a slider, glider, or any type of device that may be moveable using any suitable type of component capable of permitting the mechanism 30 to move, slide, or guide, such as rollers, wheels, sliders, magnets, electrical contacts, lubricants, or just through frictional movement without use of any such component. The mechanism 30 may move in type of motion including translational motion or rotational motion. In an example, the mechanism 30 may move between the first end 20 and the second end 25 of the frame 15. In some examples, the mechanism 30 may or may not contact the frame 15. For example, the mechanism 30 may be suspended over the frame 15 by other retaining devices or mechanism (not shown) or may be suspended over the frame 15 using magnetic forces to retain the mechanism 30 within the confines of the frame 15, but without contacting the frame 15.

The device 10 further comprises a first buckling member 45 attached to the first side 35 of the mechanism 30 and the first end 20 of the frame 15. The first buckling member 45 may comprise any suitable size, shape, or configuration. In an example, the first buckling member 45 may be configured as a strip of flexible material with a sufficient length, width, and thickness to bend and return back to its original configuration without fracture, material deterioration, or structural degradation. In other words, the first buckling member 45 contains a sufficiently high failure strain such that the first buckling member 45 can buckle without fracturing. Any suitable metal or polymer material may be used for the first buckling member 45. For example, rolled steel such as the type used for constructing a measuring tape could be used as the material for the first buckling member 45. Accordingly, a strip of spring steel with a curvature along the width (e.g., a piece of measuring tape) has the ability to buckle repeatedly without becoming damaged or structurally deficient. The first buckling member 45 may be permanently or removably attached to the first side 35 of the mechanism 30 and the first end 20 of the frame 15 using any suitable type of attachment component including mechanical and magnetic components, and/or adhesives, or a combination thereof, so long as the bonding strength of the first buckling member 45 to both the first side 35 of the mechanism 30 and the first end 20 of the frame 15 is sufficiently strong to withstand any forces applied to the first buckling member 45 or the mechanism 30. In other words, the bonding strength should be greater than any forces applied to the first buckling member 45 causing the first buckling member 45 to bend, flex, buckle, or otherwise alter its configuration and greater than any forces applied to the mechanism 30 to allow the mechanism 30 to move. Accordingly, the first buckling member 45 should stay attached to the first side 35 of the mechanism 30 and the first end 20 of the frame 15 unless a user purposefully removes the first buckling member 45 from the first side 35 of the mechanism 30 and/or first end 20 of the frame 15.

The device 10 further comprises a second buckling member 50 attached to the second side 40 of the mechanism 30 and the second end 25 of the frame 15. In an example, the first side 35 and second side 40 of the mechanism 30 are on opposite sides of the mechanism 30 such that the first side 35 faces away from the second side 40. In other examples, the first side 35 and the second side 40 may be angularly positioned with respect to one another. The second buckling member 50 may comprise any suitable size, shape, or configuration. In an example, the second buckling member 50 may be configured as a strip of flexible material with a sufficient length, width, and thickness to bend and return back to its original configuration without fracture, material deterioration, or structural degradation. In other words, the second buckling member 50 contains a sufficiently high failure strain such that the second buckling member 50 can buckle without fracturing. Any suitable metal or polymer material may be used for the second buckling member 50. For example, rolled steel such as the type used for constructing a measuring tape could be used as the material for the second buckling member 50. The second buckling member 50 may be permanently or removably attached to the second side 40 of the mechanism 30 and the second end 25 of the frame 15 using any suitable type of attachment component including mechanical and magnetic components, and/or adhesives, or a combination thereof, so long as the bonding strength of the second buckling member 50 to both second side 40 of the mechanism 30 and the second end 25 of the frame 15 is sufficiently strong to withstand any forces applied to the second buckling member 50 or the mechanism 30. In other words, the bonding strength should be greater than any forces applied to the second buckling member 50 causing the second buckling member 50 to bend, flex, buckle, or otherwise alter its configuration and greater than any forces applied to the mechanism 30 to allow the mechanism 30 to move. Accordingly, the second buckling member 50 should stay attached to the second side 40 of the mechanism 30 and the second end 25 of the frame 15 unless a user purposefully removes the second buckling member 50 from the second side 40 of the mechanism 30 and/or second end 25 of the frame 15.

The device 10 further comprises at least one actuator 55 that engages the mechanism 30, the first buckling member 45, and the second buckling member 50 in a selective sequence causing the mechanism 30 to articulate between the first end 20 and the second end 25 of the frame 15. The at least one actuator 55 may comprise any suitable size, shape, configuration, or number of components. For example, the at least one actuator 55 may vary from a very small (e.g., micro-sized) to a very large (e.g., meter-sized) device. Furthermore, the at least one actuator 55 may contain an individual component or a combination of components that are discrete structures or may be linked together. In an example, the at least one actuator 55 may be attached to the frame 15 such that the at least one actuator 55 may be positioned within the frame 15 in a non-actuated state and then may extend from the frame 15 upon actuation. According to some examples, the at least one actuator 55 may comprise any of an electro-mechanical, electro-magnetic, mechanical, magnetic device, magnetic, pneumatic, hydraulic, electroactive, thermally active, and motorize device, or a combination thereof. The actuation of the at least one actuator 55 may be controlled using a processor (not shown in FIGS. 1A through 1E) that transmit a signal to the at least one actuator 55 causing actuation. The transmission of the signal may be timed according to pre-set instructions executed by the processor. When the first buckling member 45 or the second buckling member 50 are buckled, the mechanism 30 can be moved. In this regard, at least one actuator 55 can act directly on the mechanism 30 to assist in moving the mechanism 30.

In another example, it is also possible that external forces acting on the mechanism 30 move the mechanism 30 between different positions once the member (e.g., the first buckling member 45 or the second buckling member 50) holding the mechanism 30 in place has buckled, requiring no actuator. In this regard, the component to cause buckling of the first buckling member 45 or the second buckling member 50 could be a separate actuator of any suitable type or operatively linked to the at least one actuator 55. In still another example, the device 10 may include multiple moving mechanisms 30 attached to the first buckling member 45 or the second buckling member 50 or to one another. Accordingly, the embodiments herein are not limited to the specific examples shown in the drawings.

According to the embodiments herein, the engagement of the first buckling member 45 and the second buckling member 50 by the at least one actuator 55 causes the first buckling member 45 and the second buckling member 50 to buckle and unbuckle in the selective sequence. In an example, the selective sequence may comprise any suitable sequence of actuation of the at least one actuator 55, buckling/unbuckling of the first buckling member 45 and the second buckling member 50, and/or movement of the mechanism 30. For example, the selective sequence may be an iterative sequence or may occur in tandem with any of the actuation, buckling/unbuckling, and/or movement actions described above.

According to the embodiments herein, the first buckling member 45 or the second buckling member 50 with a high axial stiffness braces a moving mechanism 30, keeping the mechanism 30 robustly in place. The at least one actuator 55 can carry load along its principal axis up to the critical buckling load of the first buckling member 45 or the second buckling member 50, which can be fairly high; however, the first buckling member 45 or the second buckling member 50 can be induced to buckle by applying a relatively low transverse load. When the first buckling member 45 or the second buckling member 50 buckles, the mechanism 30 is free to move. The at least one actuator 55 can be placed in line with the direction of movement of the mechanism 30 to assist with movement of the mechanism 30. Once the mechanism 30 reaches a desired position, another member that was previously buckled unbuckles, bracing the mechanism 30, keeping it robustly in place in the new position.

FIGS. 2A and 2B, with reference to FIGS. 1A through 1E, are schematic diagrams illustrating sequential conditions where the at least one actuator 55 may comprise a first actuator 55a that applies a first force $F_1$ to the mechanism 30 causing the mechanism 30 to move from a first position 60 to a second position 65; and a second actuator 55b that applies a second force $F_2$ to the second buckling member 50 causing the second buckling member 50 to buckle and the first buckling member 45 to unbuckle. FIG. 2A depicts an example of a first stable condition of the device 10. FIG. 2B depicts an example of an activated condition where the first actuator 55a and the second actuator 55b are activated or actuated resulting in the mechanism 30 moving from the first position 60 (of FIG. 2A) to the second position 65 (of FIG. 2B). Upon the mechanism 30 reaching the second position 65, the device 10 is in a second stable condition, which is further described below. In an example, the first actuator 55a and the second actuator 55b may simultaneously apply the first force $F_1$ and the second force $F_2$, respectively. In another example, the first actuator 55a and the second actuator 55b may sequentially apply the first force $F_1$ and the second force $F_2$, respectively, such that the timing may be controlled according to a pre-programmed timing sequence.

FIGS. 3A and 3B, with reference to FIGS. 1A through 2B, are schematic diagrams illustrating sequential conditions where the at least one actuator 55 may comprise a third actuator 55c that applies a third force $F_3$ to the mechanism 30 causing the mechanism 30 to move from the second position 65 to the first position 60; and a fourth actuator 55d that applies a fourth force $F_4$ to the first buckling member 45 causing the first buckling member 45 to buckle and the second buckling member 50 to unbuckle. FIG. 3A depicts an example of a second stable condition of the device 10. FIG. 3B depicts an example of an activated condition where the third actuator 55c and the fourth actuator 55d are activated or actuated resulting in the mechanism 30 moving from the second position 65 (of FIGS. 2B and 3A) back to the first position 60 (of FIGS. 2A and 3B). Upon the mechanism 30 returning back to the first position 60 (of FIG. 2A), the device 10 is back in the first stable condition, and is ready to once again be actuated in the same sequence described above to iteratively articulate the mechanism from the first position 60 to the second position 65 and back to the first position 65, etc.

In an example, the third actuator 55c and the fourth actuator 55d may simultaneously apply the third force $F_3$ and the fourth force $F_4$, respectively. In another example, the third actuator 55c and the fourth actuator 55d may sequentially apply the third force $F_3$ and the fourth force $F_4$, respectively, such that the timing may be controlled according to a pre-programmed timing sequence.

According to some examples, the first force $F_1$ and the third force $F_3$ may comprise axial forces applied to the mechanism 30 by the first actuator 55a and the third actuator 55c, respectively. Moreover, according to some examples, the second force $F_2$ and the fourth force $F_4$ may comprise transverse forces applied to the second buckling member 50 and the first buckling member 45, respectively by the second actuator 55b and the fourth actuator 55d, respectively. Furthermore, the first actuator 55a, second actuator 55b, third actuator 55c, and fourth actuator 55d may be structurally independent of each other or may be linked to each other in various combinations.

The sliding mechanism 30 is able to move on, above, or in the frame 15 with stops at each end (e.g., the first end 20 and second end 25). When the mechanism 30 is positioned at first end 20, the mechanism 30 is braced by a member (e.g., first buckling member 45 or second buckling member 50) attached to the mechanism 30 and the frame 15 at the second end 25. The member (e.g., first buckling member 45 or second buckling member 50) has the ability to buckle and unbuckle without inducing or undergoing significant mechanical damage. The attachment of the first buckling member 45 and second buckling member 50 prevents the mechanism 30 from moving unless an external force (e.g., such as provided by the at least one actuator 55 (e.g., first actuator 55a and third actuator 55c)) acting on the mechanism 30 in the direction of sliding exceeds the critical buckling load of the member (e.g., first buckling member 45 or second buckling member 50). Accordingly, no energy is needed to keep the mechanism 30 from moving.

The at least one actuator 55 (e.g., second actuator 55b and fourth actuator 55d) to apply force transverse to the buckling member (e.g., first buckling member 45 or second buckling member 50) may be attached to the frame 15, and when desired, can act on the buckling member (e.g., first buckling member 45 or second buckling member 50) at or near the center of the mechanism 30. This force causes the member (e.g., first buckling member 45 or second buckling member 50) to buckle and can be much less than the critical buckling load, based on the configuration of the member (e.g., first buckling member 45 or second buckling member 50). When the first buckling member 45 has buckled, the mechanism 30 is free to move on, above, or within the frame 15.

The structural arrangement of the device 10 described above may be mirrored on either side of the mechanism 30 such that when the mechanism 30 reaches the second end 25 of the frame 15, the second buckling member 50 that was previously buckled straightens and becomes unbuckled, bracing the mechanism 30 in that second position. The at least one actuator 55 (e.g., second actuator 55b) to buckle the second buckling member 50 can be similarly activated as described above with respect to the first buckling member 45 to allow the mechanism 30 to move again.

Figure 4A:
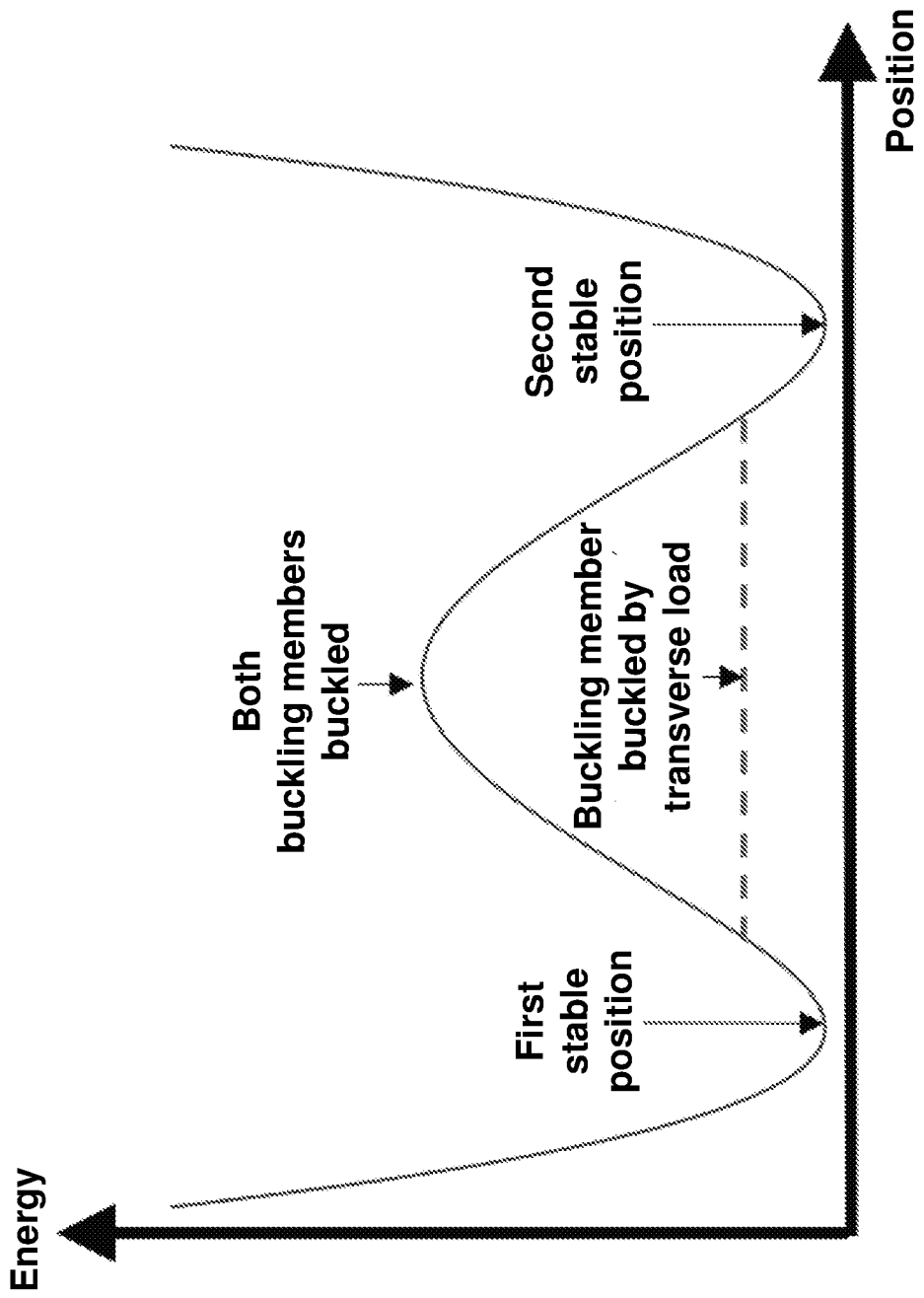
FIG. 4A is a graphical diagram illustrating the energy required to allow the articulating mechanism of the device of FIGS. 1A through 1E to move, according to an embodiment herein.
Figure 4B:
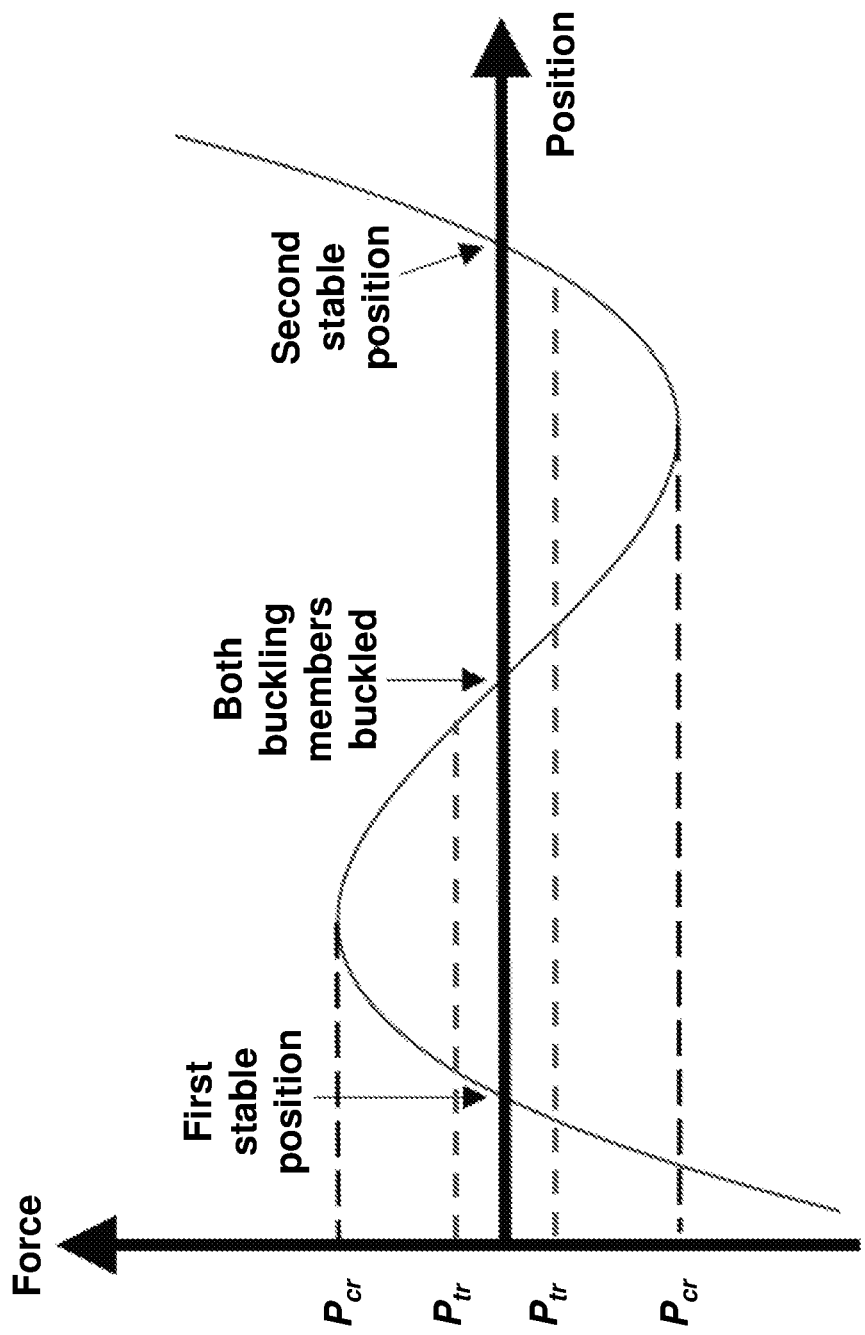
FIG. 4B is a graphical diagram illustrating the force applied to the articulating mechanism of the device of FIGS. 1A through 1E to cause movement of the articulating mechanism, according to an embodiment herein.

FIGS. 4A and 4B, with reference to FIGS. 1A through 3B, are graphical diagrams for a bistable system illustrating the notational energy required to allow the mechanism 30 to move, and the force applied to the mechanism 30 to cause movement of the mechanism 30, according to an embodiment herein. As shown in FIG. 4A, the energy required to keep the device 10 in the first and second stable conditions (e.g., first position 60 and second position 65) is lower than the energy required when both the first buckling member 45 and the second buckling member 50 are buckled. In FIG. 4B, $P_{cr}$ is the critical buckling load for a buckling member (e.g., the first buckling member 45 and the second buckling member 50, for example), and $P_{tr}$ is the transverse load required to buckle the buckling member (e.g., the first buckling member 45 and the second buckling member 50, for example). One aspect of the device 10 is (1) its relatively high stability when the mechanism 30 is at one end (e.g., the first end 20 or the second end 25 of the frame 15) and a buckling member (e.g., the first buckling member 45 or the second buckling member 50) is in an unbuckled configuration, (2) relatively low stability when both the first buckling member 45 and the second buckling member 50 are buckled, and (3) the relatively low energy required to move the device 10 between high stability and low stability.

In an example, because the mechanism 30 moves in the same direction as the length of the unbuckled member (which could be either the first buckling member 45 or the second buckling member 50 depending on the state of activation of the device 10), it can only axially load the unbuckled member, either in tension or compression. In tension the member is limited by its tensile strength, a material property; in compression the member is limited by its critical buckling load, a material and geometric property. The buckling load of an axially loaded structural member can be very high. Accordingly, the device 10 can be configured to carry a wide range of external loads applied to the mechanism 30. Moreover, the member (e.g., the first buckling member 45 or the second buckling member 50) can be buckled with a much lower force if the force is applied transverse to the member (e.g., the first buckling member 45 or the second buckling member 50). By incorporating the at least one actuator 55 that applies a transverse load to the member (e.g., the first buckling member 45 or the second buckling member 50), the device 10 can be triggered to allow the mechanism 30 to move once the transverse actuator (e.g., the second actuator 55b of the fourth actuator 55d) buckles the member (e.g., the first buckling member 45 or the second buckling member 50). In this way the energy required to allow the mechanism 30 to move is much lower than the work required to buckle the member (e.g., the first buckling member 45 or the second buckling member 50) via axial loading through externally applied load on the mechanism 30.

FIG. 5, with reference to FIGS. 1A through 4B, is a schematic diagram illustrating that the first buckling member 45 and the second buckling member 50 each may comprise a length L longer than a width W or thickness T thereof. Moreover, the first buckling member 45 and the second buckling member 50 each may comprise a predetermined failure strain to allow the first buckling member 45 and the second buckling member 50 to buckle without fracturing.

The configuration of the first buckling member 45 and the second buckling member 50 and how the first buckling member 45 and the second buckling member 50 are attached to the mechanism 30 and frame 15 can be tailored to achieve the desired buckling load. As described above, the first buckling member 45 and the second buckling member 50 may be a piece of material with the length L longer than the width W or thickness T and have a sufficiently high failure strain such that the first buckling member 45 and the second buckling member 50 can buckle without fracturing. To provide for this functionality, and as described above, many metals and polymers may be used for first buckling member 45 and the second buckling member 50. The buckling load is determined by the length, cross-sectional shape and size, and attachment method of the member through the equation:

$$P_{cr} = \frac{\pi^2 EI}{k^2 L^2}$$

where E is the modulus of elasticity, I is the second moment of area, k is a factor related to the attachment method (boundary condition), and L is the length, and as such any of those parameters can be tailored to achieve a desired buckling load.

FIG. 6, with reference to FIGS. 1A through 5, is a block diagram illustrating a switch 110 comprising at least one mechanism 130 configured to move along a path 170. The mechanism 130 may be an electro-mechanical, electromagnetic, mechanical, or magnetic device, or a combination thereof. Furthermore, the mechanism 130 may comprise any suitable size, shape, or configuration. In an example, the movement of the mechanism 130 is constrained by the path 170. The mechanism 130, which may be a slider, glider, or any type of device that may be moveable using any suitable type of component capable of permitting the mechanism 130 to move, slide, or guide, such as rollers, wheels, sliders, magnets, electrical contacts, lubricants, or just through frictional movement without use of any such component. The mechanism 130 may move in type of motion including translational motion or rotational motion.

The switch 110 further comprises a first buckling member 145 attached to the at least one mechanism 130. The first buckling member 145 may comprise any suitable size, shape, or configuration. In an example, the first buckling member 145 may be configured as a strip of flexible material with a sufficient length, width, and thickness to bend and return back to its original configuration without fracture, material deterioration, or structural degradation. In other words, the first buckling member 145 contains a sufficiently high failure strain such that the first buckling member 145 can buckle without fracturing. Any suitable metal or polymer material may be used for the first buckling member 145.

For example, rolled steel such as the type used for constructing a measuring tape could be used as the material for the first buckling member 145. Accordingly, a strip of spring steel with a curvature along the width (e.g., a piece of measuring tape) has the ability to buckle repeatedly without becoming damaged or structurally deficient. The first buckling member 145 may be permanently or removably attached to the mechanism 130 using any suitable type of attachment component including mechanical and magnetic components, and/or adhesives, or a combination thereof, so long as the bonding strength of the first buckling member 145 to the mechanism 130 is sufficiently strong to withstand any forces applied to the first buckling member 145 or the mechanism 130. In other words, the bonding strength should be greater than any forces applied to the first buckling member 145 causing the first buckling member 145 to bend, flex, buckle, or otherwise alter its configuration and greater than any forces applied to the mechanism 130 to allow the mechanism 130 to move. Accordingly, the first buckling member 145 should stay attached to the mechanism unless a user purposefully removes the first buckling member 145 from the mechanism 130.

The switch 110 further comprises a second buckling member 150 attached to the at least one mechanism 130. The second buckling member 150 may comprise any suitable size, shape, or configuration. In an example, the second buckling member 150 may be configured as a strip of flexible material with a sufficient length, width, and thickness to bend and return back to its original configuration without fracture, material deterioration, or structural degradation. In other words, the second buckling member 150 contains a sufficiently high failure strain such that the second buckling member 150 can buckle without fracturing. Any suitable metal or polymer material may be used for the second buckling member 150. For example, rolled steel such as the type used for constructing a measuring tape could be used as the material for the second buckling member 150. The second buckling member 150 may be permanently or removably attached to the mechanism 130 using any suitable type of attachment component including mechanical and magnetic components, and/or adhesives, or a combination thereof, so long as the bonding strength of the second buckling member 150 to the mechanism 130 is sufficiently strong to withstand any forces applied to the second buckling member 150 or the mechanism 130. In other words, the bonding strength should be greater than any forces applied to the second buckling member 150 causing the second buckling member 150 to bend, flex, buckle, or otherwise alter its configuration and greater than any forces applied to the mechanism 130 to allow the mechanism 130 to move. Accordingly, the second buckling member 150 should stay attached to the mechanism 130 unless a user purposefully removes the second buckling member 150 from the mechanism 130.

The switch 110 may comprise a first actuator system 155a that selectively (i) engages the first buckling member 145 and disengages the second buckling member 150, and (ii) disengages the first buckling member 145 and engages the second buckling member 150. The selective engagement and disengagement of the first buckling member 145 and the second buckling member 150 results in movement of the at least one mechanism 130.

The first actuator system 155a may comprise any suitable size, shape, configuration, or number of components. For example, the first actuator system 155a may vary from a very small (e.g., micro-sized) to a very large (e.g., meter-sized) device. Furthermore, the first actuator system 155a may contain an individual component or a combination of components that are discrete structures or may be linked together. According to some examples, the first actuator system 155a may comprise any of an electro-mechanical, electro-magnetic, mechanical, magnetic device, magnetic, pneumatic, hydraulic, electroactive, thermally active, and motorize device, or a combination thereof.

FIG. 7, with reference to FIGS. 1A through 6, is a block diagram illustrating that the switch 110 may comprise a second actuator system 155b that selectively engages the at least one mechanism 130 causing the at least one mechanism 130 to move from a first position 160 to a second position 165 and back to the first position 160. The second actuator system 155ba may comprise any suitable size, shape, configuration, or number of components. For example, the second actuator system 155ba may vary from a very small (e.g., micro-sized) to a very large (e.g., meter-sized) device. Furthermore, the second actuator system 155ba may contain an individual component or a combination of components that are discrete structures or may be linked together. According to some examples, the second actuator system 155ba may comprise any of an electro-mechanical, electro-magnetic, mechanical, magnetic device, magnetic, pneumatic, hydraulic, electroactive, thermally active, and motorize device, or a combination thereof.

Figure 8:
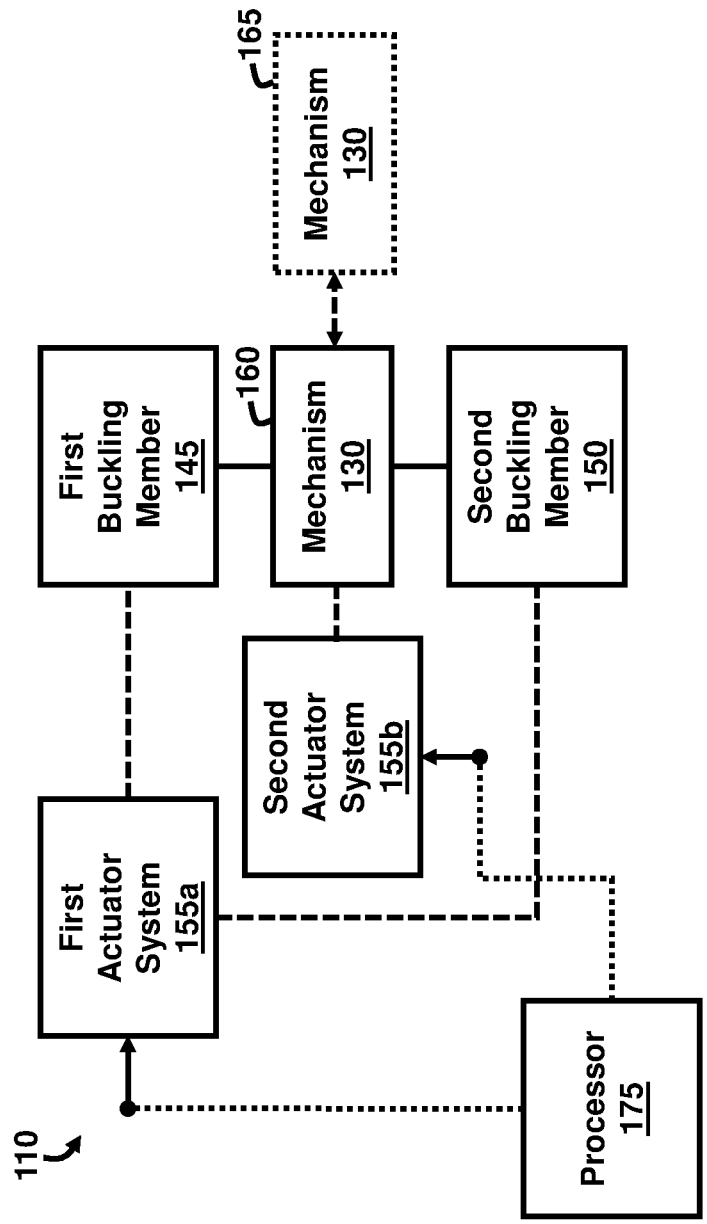
FIG. 8 is a block diagram illustrating the switch of FIG. 6 with individual control of the first and second actuator systems, according to an embodiment herein.

FIG. 8, with reference to FIGS. 1A through 7, is a block diagram illustrating that the first actuator system 155a and the second actuator system 155b may be individually controlled. In an example, the first actuator system 155a and the second actuator system 155b may be controlled by a processor 175. In an example, the processor 175 may transmit a signal(s) to the first actuator system 155a and the second actuator system 155b causing actuation. The transmission of the signal(s) may be timed according to pre-set instructions executed by the processor 175.

Any of the first actuator system 155a and the second actuator system 155b may be wirelessly connected to the processor 175 or may be operatively connected through a wired connection such that the first actuator system 155a and the second actuator system 155b may receive signals (including mobile communication signals) from the processor 175 related to the computer-executable actuation instructions. For example, the mobile communication signals may be signals in accordance with any suitable type of communication standard or protocol such as the 802.11b wireless communication standard, as well as Bluetooth®, ZigBee®, and Radio-frequency identification (RFID) standards, for example. Accordingly, as described above, the first actuator system 155a, the second actuator system 155b, and the processor 175 may be wired or wirelessly linked to one another.

Various examples described herein with respect to the processor 175 may include both hardware and software elements. The examples that are implemented in software may include firmware, resident software, microcode, etc. Other examples may include a computer program product configured to include a pre-configured set of instructions, which when performed or executed by a computer, may result in actions as stated in conjunction with the techniques described above. In an example, the pre-configured set of instructions may be stored on a tangible non-transitory computer readable medium or a program storage device containing software code.

In some examples, the processor 175 and various other processing devices described herein and/or illustrated in the figures may be embodied as hardware-enabled modules and may be configured as a plurality of overlapping or independent electronic circuits, devices, and discrete elements packaged onto a circuit board to provide data and signal processing functionality within a computer and/or electronic device. An example might be a comparator, inverter, or flip-flop, which could include a plurality of transistors and other supporting devices and circuit elements. The modules that are configured with electronic circuits process computer logic instructions capable of providing digital and/or analog signals for performing various functions as described herein. The various functions can further be embodied and physically saved as any of data structures, data paths, data objects, data object models, object files, database components. For example, the data objects could be configured as a digital packet of structured data. The data structures could be configured as any of an array, tuple, map, union, variant, set, graph, tree, node, and an object, which may be stored and retrieved by computer memory and may be managed by processors, compilers, and other computer hardware components. The data paths can be configured as part of a computer central processing unit (CPU) that performs operations and calculations as instructed by the computer logic instructions. The data paths could include digital electronic circuits, multipliers, registers, and buses capable of performing data processing operations and arithmetic operations (e.g., Add, Subtract, etc.), bitwise logical operations (AND, OR, XOR, etc.), bit shift operations (e.g., arithmetic, logical, rotate, etc.), complex operations (e.g., using single clock calculations, sequential calculations, iterative calculations, etc.). The data objects may be configured as physical locations in computer memory and can be a variable, a data structure, or a function. In the embodiments configured as relational databases (e.g., such as Oracle® relational databases), the data objects can be configured as a table or column. Other configurations include specialized objects, distributed objects, object-oriented programming objects, and semantic web objects, for example. The data object models can be configured as an application programming interface for creating HyperText Markup Language (HTML) and Extensible Markup Language (XML) electronic documents. The models can be further configured as any of a tree, graph, container, list, map, queue, set, stack, and variations thereof. The data object files are created by compilers and assemblers and contain generated binary code and data for a source file. The database components can include any of tables, indexes, views, stored procedures, and triggers.

The processor 175 may comprise any of an integrated circuit, an application-specific integrated circuit (ASIC), field-programmable gate array (FPGA), a microcontroller, a microprocessor, an ASIC processor, a digital signal processor, a networking processor, a multi-core processor, or other suitable processors selected to be communicatively linked to the sensor. In some examples, the processor 175 may comprise a CPU (not shown) operatively connected to the switch 110. In other examples the processor 175 may be a discrete component independent of other processing components of the switch 110. In other examples, the processor 175 may be a microcontroller, hardware engine, hardware pipeline, and/or other hardware-enabled device suitable for receiving, processing, operating, and performing various functions required by the switch 110. The processor 175 may be provided in the switch 110 coupled to the switch 110, or communicatively linked to the switch 110 from a remote networked location, according to various examples.

The processing techniques performed by the processor 175 may be implemented as one or more software modules in a set of logic instructions stored in a machine or computer-readable storage medium such as random-access memory (RAM), read only memory (ROM), programmable ROM (PROM), firmware, flash memory, etc. in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. For example, computer program code to carry out processing operations performed by the processor 175 may be written in any combination of one or more programming languages.

The processor 175 may include a central processing unit, microprocessors, hardware engines, and/or other hardware devices suitable for retrieval and execution of instructions stored in a machine-readable storage medium such that the processor 175 may fetch, decode, and execute computer-executable instructions to enable execution of locally-hosted or remotely-hosted applications for controlling action of the switch 110. The remotely-hosted applications may be accessible on one or more remotely-located devices (not shown). For example, the remotely-located devices may be a computer, tablet, smartphone, or remote server. As an alternative or in addition to retrieving and executing instructions, processor 175 may include one or more electronic circuits including a number of electronic components for performing the functionality of one or more of the computer-executable instructions.

The machine-readable storage medium may be any electronic, magnetic, optical, or other physical storage device that stores executable instructions. Thus, the machine-readable storage medium may be, for example, Random Access Memory (RAM), an Electrically-Erasable Programmable Read-Only Memory (EPROM), volatile memory, non-volatile memory, flash memory, a storage drive (e.g., a hard drive), a solid-state drive, optical drive, any type of storage disc (e.g., a compact disc, a digital versatile disc (DVD), etc.), and the like, or a combination thereof. In one example, the machine-readable storage medium may include a non-transitory computer-readable storage medium. The machine-readable storage medium may be encoded with executable instructions for enabling execution of remotely-hosted applications accessed on the one or more remotely-located devices.

Figure 9:
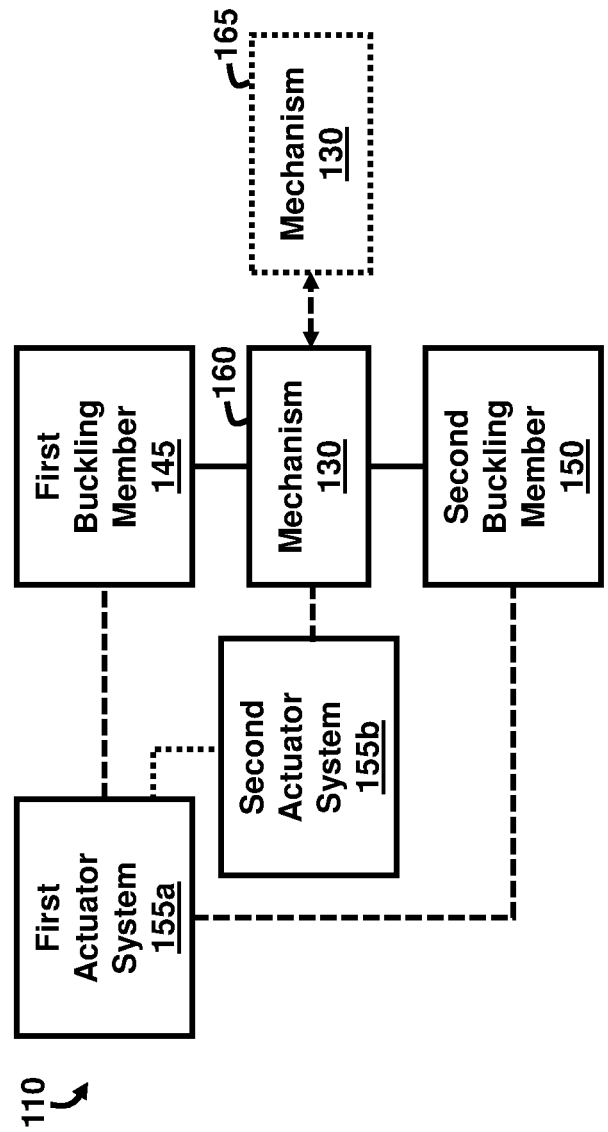
FIG. 9 is a block diagram illustrating the switch of FIG. 6 with the first and second actuator systems being linked with each other, according to an embodiment herein.

FIG. 9, with reference to FIGS. 1A through 8, is a block diagram illustrating that the first actuator system 155*a* and the second actuator system 155*b* may be linked to each other. In an example, the first actuator system 155*a* and the second actuator system 155*b* may be directly connected to each other or may be indirectly connected to each other using intervening parts and components. According to an example, the linkage between the first actuator system 155*a* and the second actuator system 155*b* may permit the first actuator system 155*a* and the second actuator system 155*b* to operate/actuate in tandem with each other.

Figure 10:
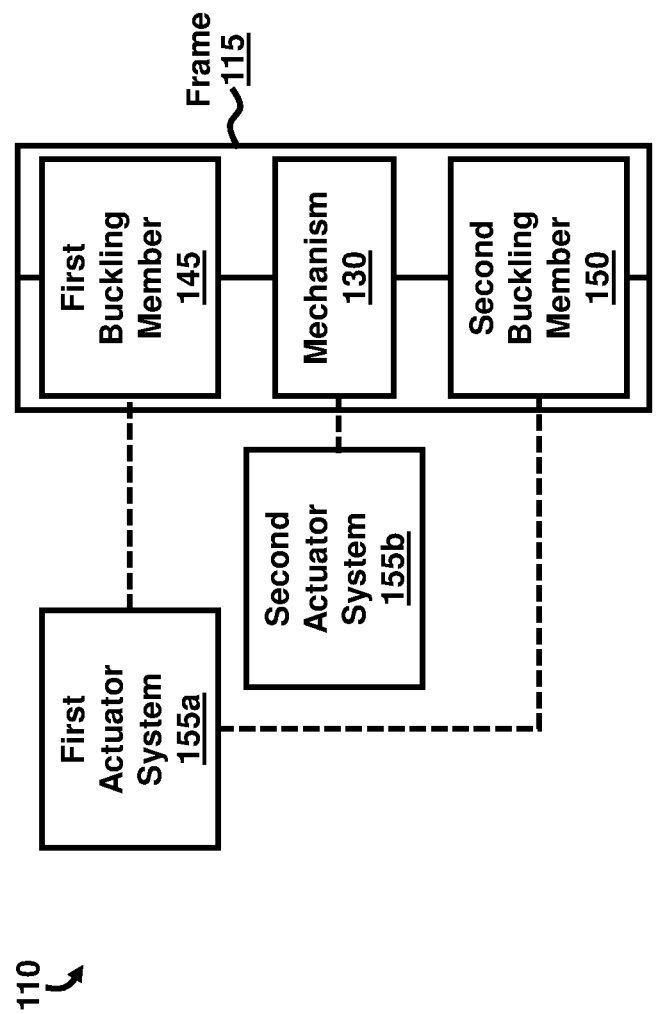
FIG. 10 is a block diagram illustrating the switch of FIG. 6 containing a frame, according to an embodiment herein.

FIG. 10, with reference to FIGS. 1A through 9, is a block diagram illustrating that the switch 110 may comprise a frame 115 housing the at least one mechanism 130. The frame 115 attaches to the first buckling member 145 and the second buckling member 150. The frame 115 may comprise any suitable size, shape, and configuration. Furthermore, the frame 115 may be a fixed structure, a moveable structure, a standalone structure, or may be part of a larger system or device and connected thereto either directly or indirectly.

Figure 11A:
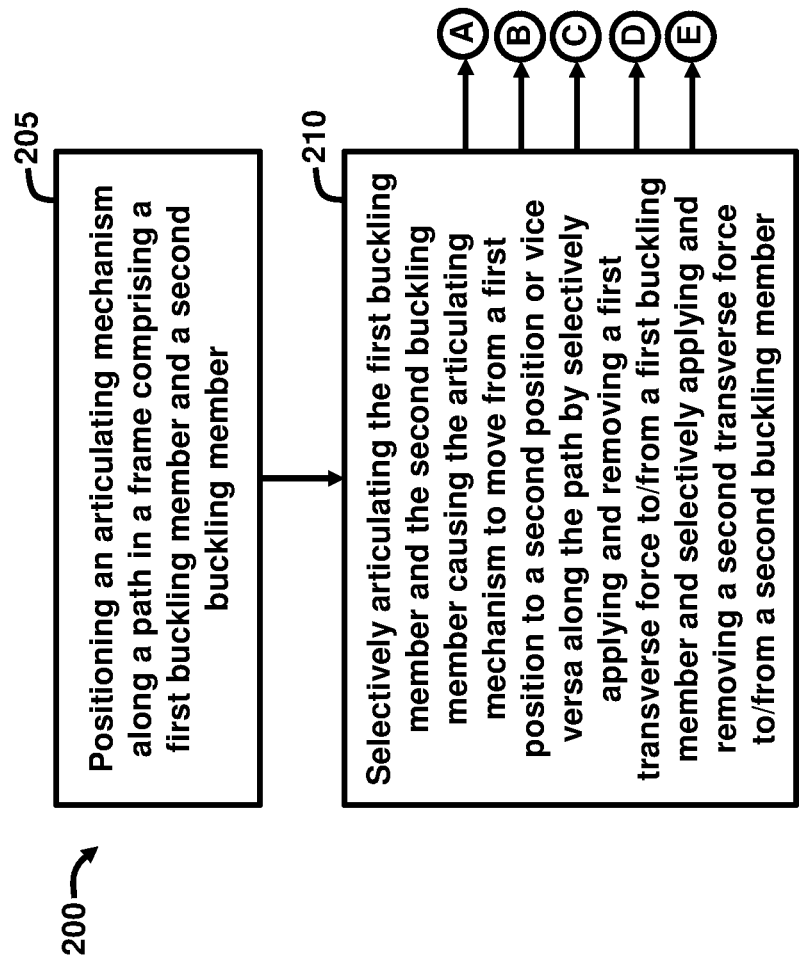
FIG. 11A is a flow diagram illustrating a method of actuation, according to an embodiment herein.

FIG. 11A, with reference to FIGS. 1A through 10, is a flow diagram illustrating a method 200 of actuation comprising positioning (205) an articulating mechanism 30, 130 along a path 170 in a frame 15, 115 comprising a first buckling member 45, 145 and a second buckling member 50, 150; and selectively articulating (210) the first buckling member 45, 145 and the second buckling member 50, 150 causing the articulating mechanism 30, 130 to move from a first position 60, 160 to a second position 65, 165 or vice versa along the path 170 by selectively applying and removing a first transverse force to/from a first buckling member 45, 145 and selectively applying and removing a second transverse force to/from a second buckling member 50, 150. According to an example, selectively articulating (210) the first buckling member 45, 145 and the second buckling member 50, 150 may occur automatically using a pre-programmed set of computer-executable instructions executed by the processor 175 such that the processor 175 may transmit a signal(s) to any of a first actuator system 155a and a second actuator system 155b to cause the at least one actuator 55 or first actuator system 155a and/or a second actuator system 155b to actuate and exert transverse forces upon the first buckling member 45, 145 and the second buckling member 50, 150 causing the first buckling member 45, 145 and the second buckling member 50, 150 to articulate between a buckling and unbuckling condition, which may correspond to the state of compression and state of tension, respectively, in one example. However, in another example, the buckling and unbuckling condition do not directly correspond to the state of compression and tension. In this regard, to be unbuckled, the load just has to be less in magnitude than the buckling load but it could still be in compression or under zero load.

Figure 11B:
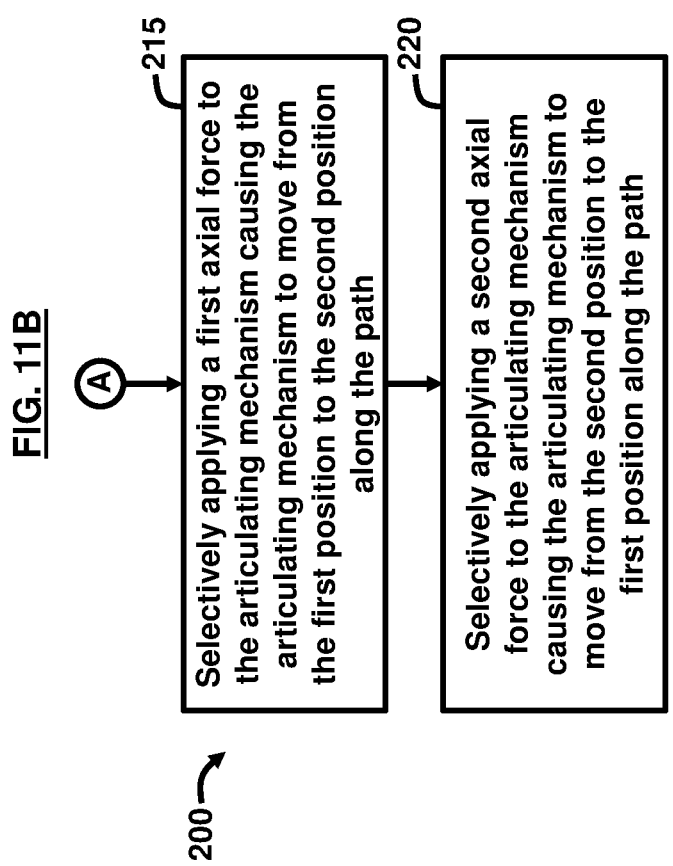
FIG. 11B is a flow diagram illustrating a method of applying axial forces to an articulating mechanism, according to an embodiment herein.

FIG. 11B, with reference to FIGS. 1A through 11A, is a flow diagram illustrating that the method 200 may comprise selectively applying (215) a first axial force to the articulating mechanism 30, 130 causing the articulating mechanism 30, 130 to move from the first position 60, 160 to the second position 65, 165 along the path 170; and selectively applying (220) a second axial force to the articulating mechanism 30, 130 causing the articulating mechanism 30, 130 to move from the second position 65, 165 to the first position 60, 160 along the path 170. In an example, the first axial force may be applied to the mechanism 30 by the first actuator 55a and the second axial force may be applied to the mechanism 30 by the second actuator 55c. In another example, the first axial force may be selectively applied to the mechanism 130 by the first actuator system 155a and the second actuator system 155b.

FIG. 11C, with reference to FIGS. 1A through 11B, is a flow diagram illustrating that the method 200 may comprise selectively moving (225) the articulating mechanism 30, 130 laterally along the path 170. In an example, the mechanism 30 may laterally move between the first end 20 and the second end 25 of the frame 15 such that the mechanism 30 may move from the first position 60 to the second position 65. In another example, the mechanism 130 may laterally move within, on, or above the frame 115 such that the mechanism 130 may move from the first position 160 to the second position 165 and back to the first position 160, etc.

FIG. 11D, with reference to FIGS. 1A through 11C, is a flow diagram illustrating that the method 200 may comprise selectively moving (230) the articulating mechanism 30, 130 rotationally along the path. For example, the rotational movement may be aided by one or more levers (not shown) that moves between two positions and is held in place by the first buckling member 45, 145 and a second buckling member 50, 150. In an example, the rotational movement of the articulating mechanism 30, 130 may be constrained to occur within the frame 15, 115.

FIG. 11E, with reference to FIGS. 1A through 11D, is a flow diagram illustrating that the method 200 may comprise applying (235) the first transverse force to the first buckling member 45, 145 and the second transverse force to the second buckling member 50, 150, wherein the first buckling member 45, 145 and the second buckling member 50, 150 are not in a state of compression simultaneously. In this example, the actuation of the second actuator 55b and the fourth actuator 55d in the device 10 or first actuator system 155a and/or a second actuator system 155b in the switch 110 may be timed such that transverse forces are applied to first buckling member 45, 145 and the second buckling member 50, 150 in a selectively timed sequence such that the first buckling member 45, 145 and the second buckling member 50, 150 are not in a state of compression at the same time. The timed sequence may be controlled by the processor 175 using a pre-programmed set of computer-executable instructions, according to an example.

FIG. 11F, with reference to FIGS. 1A through 11E, is a flow diagram illustrating that the method 200 may comprise applying (240) the first transverse force to the first buckling member 45, 145 and the second transverse force to the second buckling member 50, 150, wherein the first buckling member 45, 145 and the second buckling member 50, 150 are in a state of compression simultaneously. In this example, the actuation of the second actuator 55b and the fourth actuator 55d in the device 10 or first actuator system 155a and/or a second actuator system 155b in the switch 110 may be timed such that transverse forces are applied to first buckling member 45, 145 and the second buckling member 50, 150 in a selectively timed sequence such that the first buckling member 45, 145 and the second buckling member 50, 150 are in a state of compression at the same time. According to an example, the timed sequence may be controlled by the processor 175 using a pre-programmed set of computer-executable instructions.

The embodiments herein provide a device 10 or switch 110 containing a mechanism 30, 130 that can robustly remain in a particular position because of a buckling member (e.g., first buckling member 45, 145 and second buckling member 50, 150) that braces the mechanism 30, 130. The mechanism 30, 130 can articulate between positions (e.g., first position 60, 160 and second position 65, 165 along a path 170) with a relatively low force applied transverse to the first buckling member 45, 145 and/or second buckling member 50, 150 causing the first buckling member 45, 145 or second buckling member 50, 150 to buckle. For example, when the first buckling member 45, 145 buckles, the mechanism 30, 130 moves to another position (e.g., from a first position 60, 160 to a second position 65, 165) along the path 170, and is braced by the second buckling member 50, 150 that unbuckles, keeping the mechanism 30, 130 robustly in the new position (e.g., the second position 65, 165) until the second buckling member 50, 150 is buckled.

The embodiments herein overcome the issue of a reconfigurable structure, wherein it is desired that the structure holds its configuration under significant load, and it is desired that the structure changes its configuration with minimal energy input. The mechanism 30, 130 is relatively unloaded when reconfiguration is desired, allowing for free movement of the mechanism 30, 130 into the other configuration, at which point the structure can carry load again in its new configuration. As such, the use of axially loaded members (e.g., first buckling member 45, 145 and second buckling member 50, 150) with a designed critical buckling load is provided by the embodiments herein. Conventional solutions involving bistability generally involve using a buckling member that is mounted transverse to the direction of sliding of a mechanism (e.g., a slider), and the slider loads the member transversely. These configurations would be suboptimal for the application provided by the embodiments herein because the external force applied to the slider would be limited by the transverse force needed to buckle the member, which would be much lower than the axial force needed to buckle the member. As such, the embodiments herein use bistability of structural members to keep the mechanism 30, 130 from moving yet will easily release when the mechanism 30, 130 needs to move. Accordingly, the embodiments herein uniquely have the buckling member (e.g., first buckling member 45, 145 and second buckling member 50, 150) in line with the motion of the mechanism 30, 130 and axially carrying the force transmitted through the actuator (e.g., the at least one actuator 55, the first actuator system 155a, and second actuator system 155b).

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A device comprising:
   a frame comprising a first end and a second end;
   a mechanism comprising a first side that faces the first end of the frame, and a second side that faces the second end of the frame;
   a first buckling member attached to the first side of the mechanism and the first end of the frame;
   a second buckling member attached to the second side of the mechanism and the second end of the frame; and
   at least one actuator that comprises a first actuator that applies a first force to the mechanism causing the mechanism to move from a first position to a second position and a second actuator that applies a second force to the second buckling member causing the second buckling member to buckle and the first buckling member to unbuckle and that engages the mechanism, the first buckling member, and the second buckling member in a selective sequence causing the mechanism to articulate between the first end and the second end of the frame,
   wherein engagement of the first buckling member and the second buckling member by the at least one actuator causes the first buckling member and the second buckling member to buckle and unbuckle in the selective sequence.

2. The device of claim 1, wherein the first actuator and the second actuator simultaneously apply the first force and the second force, respectively.

3. The device of claim 1, wherein the at least one actuator comprises:

a third actuator that applies a third force to the mechanism causing the mechanism to move from the second position to the first position; and
a fourth actuator that applies a fourth force to the first buckling member causing the first buckling member to buckle and the second buckling member to unbuckle.

4. The device of claim 3, wherein the third actuator and the fourth actuator simultaneously apply the third force and the fourth force, respectively.

5. The device of claim 4, wherein the first force and the third force comprise axial forces applied to the mechanism.

6. The device of claim 4, wherein the second force and the fourth force comprise transverse forces applied to the second buckling member and the first buckling member, respectively.

7. The device of claim 1, wherein the first buckling member and the second buckling member each comprises a length longer than a width or thickness thereof.

8. The device of claim 1, wherein the first buckling member and the second buckling member each comprises a predetermined failure strain to allow the first buckling member and the second buckling member to buckle without fracturing.

9. A switch comprising:
   at least one mechanism configured to move;
   a first buckling member attached to the at least one mechanism;
   a second buckling member attached to the at least one mechanism; and
   a first actuator system that comprises a first actuator that applies a first force to the mechanism causing the mechanism to move from a first position to a second position and a second actuator that applies a second force to the second buckling member causing the second buckling member to buckle and the first buckling member to unbuckle and that selectively (i) engages the first buckling member and disengages the second buckling member, and (ii) disengages the first buckling member and engages the second buckling,
   wherein selective engagement and disengagement of the first buckling member and the second buckling member results in movement of the at least one mechanism.

10. The switch of claim 9, comprising a second actuator system that selectively engages the at least one mechanism causing the at least one mechanism to move from a first position to a second position and back to the first position.

11. The switch of claim 9, wherein the first actuator system and the second actuator system are individually controlled.

12. The switch of claim 9, wherein the first actuator system and the second actuator system are linked to each other.

13. The switch of claim 9, comprising a frame housing the at least one mechanism, wherein the frame attaches to the first buckling member and the second buckling member.

14. A method of actuation comprising:
   positioning an articulating mechanism along a path in a frame comprising a first buckling member and a second buckling member and at least one actuator that comprises a first actuator that applies a first force to the mechanism causing the mechanism to move from a first position to a second position and a second actuator that applies a second force to the second buckling member causing the second buckling member to buckle and the first buckling member to unbuckle; and
   selectively articulating the first buckling member and the second buckling member causing the articulating mechanism to move from a first position to a second position or vice versa along the path by selectively applying and removing a first transverse force to/from a first buckling member and selectively applying and removing a second transverse force to/from a second buckling member.

15. The method of claim 14, comprising:
selectively applying a first axial force to the articulating mechanism causing the articulating mechanism to move from the first position to the second position along the path; and
selectively applying a second axial force to the articulating mechanism causing the articulating mechanism to move from the second position to the first position along the path.

16. The method of claim 14, comprising selectively moving the articulating mechanism laterally along the path.

17. The method of claim 14, comprising selectively moving the articulating mechanism rotationally along the path.

18. The method of claim 14, comprising applying the first transverse force to the first buckling member and the second transverse force to the second buckling member, wherein the first buckling member and the second buckling member are not in a state of compression simultaneously.

19. The method of claim 14, comprising applying the first transverse force to the first buckling member and the second transverse force to the second buckling member, wherein the first buckling member and the second buckling member are in a state of compression simultaneously.

* * * * *